United States Patent
Han (10) Patent No.: US 12,453,112 B2
(45) Date of Patent: Oct. 21, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 726 days.

(21) Appl. No.: 17/663,283

(22) Filed: May 13, 2022

(65) Prior Publication Data
US 2023/0007933 A1     Jan. 12, 2023

Related U.S. Application Data

(63) Continuation of application No. PCT/CN2022/076372, filed on Feb. 15, 2022.

(30) Foreign Application Priority Data

Jul. 9, 2021    (CN) .......................... 202110780756.2

(51) Int. Cl.
    *H10D 30/01*        (2025.01)
    *H10B 12/00*        (2023.01)

(52) U.S. Cl.
CPC ....... *H10D 30/025* (2025.01); *H10B 12/0335* (2023.02); *H10B 12/488* (2023.02)

(58) Field of Classification Search
CPC ............. H10D 30/025; H10D 30/6728; H10B 12/0335; H10B 12/488; H10B 12/31; H10B 12/05; H10B 12/315; H10B 12/482
See application file for complete search history.

(56) References Cited

U.S. PATENT DOCUMENTS

| | | | |
|---|---|---|---|
| 5,627,390 A | 5/1997 | Maeda et al. | |
| 5,990,509 A | 11/1999 | Burns, Jr. et al. | |

(Continued)

FOREIGN PATENT DOCUMENTS

| | | | |
|---|---|---|---|
| CN | 101572258 A | 11/2009 | |
| CN | 101908553 A | 12/2010 | |

(Continued)

OTHER PUBLICATIONS

International Search Report cited in PCT/CN2021/128087 mailed Mar. 28, 2022, 9 pages.

(Continued)

*Primary Examiner* — Su C Kim
(74) *Attorney, Agent, or Firm* — Kilpatrick Townsend & Stockton LLP (57) ABSTRACT

The present disclosure provides a method of manufacturing a semiconductor structure and a semiconductor structure, and relates to the technical field of semiconductors. The method of manufacturing a semiconductor structure includes: providing a base; forming a functional stack on the base, wherein the functional stack includes a first doped layer, a second doped layer and a third doped layer that are stacked sequentially, the first doped layer is provided on the base, dopant ions in the second doped layer are different from dopant ions in the first doped layer, and the dopant ions in the first doped layer are the same as dopant ions in the third doped layer; and removing a part of the functional stack to form a plurality of active pillars arranged at intervals.

11 Claims, 9 Drawing Sheets

(56) References Cited

U.S. PATENT DOCUMENTS

| | | | |
|---|---|---|---|
| 7,968,876 | B2 | 6/2011 | Lung et al. |
| 8,921,930 | B2 * | 12/2014 | Hwang ............... H10D 30/025 |
| | | | 257/330 |
| 10,361,206 | B2 | 7/2019 | Moon et al. |
| 10,629,615 | B1 | 4/2020 | Hu et al. |
| 2006/0113587 | A1 | 6/2006 | Thies et al. |
| 2007/0051994 | A1 | 3/2007 | Song et al. |
| 2009/0273088 | A1 | 11/2009 | Chung et al. |
| 2010/0052029 | A1 | 3/2010 | Huang |
| 2010/0295123 | A1 | 11/2010 | Lung et al. |
| 2012/0052674 | A1 | 3/2012 | Lee et al. |
| 2012/0064704 | A1 | 3/2012 | Kim |
| 2012/0080725 | A1 | 4/2012 | Manos et al. |
| 2012/0119286 | A1 | 5/2012 | Kim et al. |
| 2012/0156844 | A1 | 6/2012 | Kim et al. |
| 2012/0156868 | A1 | 6/2012 | Kim et al. |
| 2013/0161710 | A1 | 6/2013 | Ji et al. |
| 2013/0234240 | A1 | 9/2013 | Moon et al. |
| 2013/0323920 | A1 | 12/2013 | Chang et al. |
| 2015/0348976 | A1 | 12/2015 | Moon et al. |
| 2016/0013292 | A1 | 1/2016 | Choi |
| 2016/0284712 | A1 | 9/2016 | Liaw |
| 2016/0284765 | A1 * | 9/2016 | Takeguchi ............ H10N 70/235 |
| 2017/0365714 | A1 * | 12/2017 | Bu ..................... H01L 21/30612 |
| 2019/0074363 | A1 | 3/2019 | Zhu |
| 2019/0157345 | A1 | 5/2019 | Zhu et al. |
| 2020/0258895 | A1 | 8/2020 | Xiao et al. |
| 2020/0295008 | A1 | 9/2020 | Tang et al. |
| 2021/0013210 | A1 | 1/2021 | Lee et al. |
| 2021/0028174 | A1 | 1/2021 | Lee |
| 2021/0066319 | A1 | 3/2021 | Chang et al. |

FOREIGN PATENT DOCUMENTS

| | | |
|---|---|---|
| CN | 102543847 A | 7/2012 |
| CN | 103311249 A | 9/2013 |
| CN | 103311249 B | 5/2017 |
| CN | 108461496 A | 8/2018 |
| CN | 108493188 A | 9/2018 |
| CN | 208127209 U | 11/2018 |
| CN | 109285836 A | 1/2019 |
| CN | 109461738 A | 3/2019 |
| CN | 208655642 U | 3/2019 |
| CN | 110896074 A | 3/2020 |
| CN | 110957319 A | 4/2020 |
| CN | 111354738 A | 6/2020 |
| CN | 111415945 A | 7/2020 |
| CN | 211719592 U | 10/2020 |
| CN | 112447734 A | 3/2021 |
| JP | H10229175 A | 8/1998 |
| JP | 2009182105 A | 8/2009 |
| JP | 2011097001 A | 5/2011 |
| JP | 2012142548 A | 7/2012 |
| JP | 2018163907 A | 10/2018 |
| KR | 1020070047572 A | 5/2007 |
| KR | 20090068713 A | 6/2009 |
| KR | 20090132298 A | 12/2009 |
| KR | 20100002675 A | 1/2010 |
| KR | 20140011570 A | 1/2014 |
| KR | 20160142803 A | 12/2016 |
| KR | 20170109170 A | 9/2017 |
| KR | 20210044282 A | 4/2021 |
| TW | 201919155 A | 5/2019 |
| TW | 1731687 B | 6/2021 |
| WO | 2018182720 A1 | 10/2018 |

OTHER PUBLICATIONS

International Search Report cited in PCT/CN2021/076372 mailed Apr. 28, 2022, 8 pages.
International Search Report cited in PCT/CN2021/117284 mailed Mar. 29, 2022, 9 pages.
International Search Report cited in PCT/CN2021/121617 mailed Mar. 3, 2022, 8 pages.
TW Office Action cited in TW111121996, mailed Nov. 22, 2022, 4 pages.
Non-Final Office Action cited in U.S. Appl. No. 17/648,732 mailed Aug. 25, 2022, 23 pages.
Non-Final Office Action cited in U.S. Appl. No. 17/659,062 mailed Aug. 25, 2022, 18 pages.
Japanese Patent Office, Office Action Issued in Application No. 2023-527715, May 28, 2024, 9 pages.
Korean Intellectual Property Office, Office Action Issued in Application No. 10-2023-7018424, Jun. 19, 2024, 11 pages.
Korean Intellectual Property Office, Office Action Issued in Application No. 10-2023-7019813, Jun. 24, 2024, 16 pages.
Japanese Patent Office, Office Action Issued in Application No. 2023-532840, Jun. 25, 2024, 5 pages.
European Patent Office, Extended European Search Report Issued in Application No. 21949873.0, Jul. 29, 2024, Germany, 8 pages.
Japanese Patent Office, Office Action Issued in Application No. 2023-535049, Aug. 6, 2024, 10 pages.
European Patent Office, Extended European Search Report Issued in Application No. 22836479.0, Oct. 1, 2024, Germany, 9 pages.
European Search Report cited in EP21870544.0, mailed Dec. 13, 2022, 7 pages.
European Search Report cited in EP21884120.3, mailed Dec. 8, 2022, 8 pages.

* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2022/076372, filed on Feb. 15, 2022, which claims the priority to Chinese Patent Application 202110780756.2, titled "METHOD OF MANUFACTURING SEMICONDUCTOR STRUCTURE AND SEMICONDUCTOR STRUCTURE" and filed with China National Intellectual Property Administration (CNIPA) on Jul. 9, 2021. The entire contents of International Application No. PCT/CN2022/076372 and Chinese Patent Application 202110780756.2 are incorporated herein by reference.

TECHNICAL FIELD

The present disclosure relates to the technical field of semiconductors, and in particular to a method of manufacturing a semiconductor structure and a semiconductor structure.

BACKGROUND

With gradual development of storage device technologies, the dynamic random access memories (DRAMs) have been widely applied to various electronic devices for the high density and fast read-write speed. While semiconductor devices are developed toward a higher integration density, research on arrangement of transistors in semiconductor structures and miniaturization of individual functional devices in semiconductor structures has aroused much concern.

In the related art, memory cells of a DRAM based on saddle-fin transistors have an area of 6F2 (F: a minimum pattern size obtainable under given process conditions). To further miniaturize the DRAM, there are problems such as the gate proximity effect when the DRAM is scaled to compromise the electrical performance of the DRAM.

When vertical gate-all-around (GAA) transistors are used as access transistors, the area can be up to $4F^2$ to realize a higher density in principle. However, due to limitations of manufacturing devices and manufacturing procedures at some sizes, when active pillars of the vertical GAA transistors are formed, it is difficult to perform ion doping on different regions of the active pillars to compromise the performance of the semiconductor structure.

SUMMARY

According to a first aspect, an embodiment of the present disclosure provides a method of manufacturing a semiconductor structure, including the following steps:

providing a base;
forming a functional stack on the base, wherein the functional stack includes a first doped layer, a second doped layer and a third doped layer that are stacked sequentially, the first doped layer is provided on the base, dopant ions in the second doped layer are different from dopant ions in the first doped layer, and the dopant ions in the first doped layer are the same as dopant ions in the third doped layer; and
removing a part of the functional stack to form a plurality of active pillars arranged at intervals, wherein the first doped layer in the active pillar serves as a first doped region, the second doped layer in the active pillar serves as a channel region, and the third doped layer in the active pillar serves as a second doped region.

According to a second aspect, an embodiment of the present disclosure provides a semiconductor structure, which is manufactured with the above method of manufacturing a semiconductor structure.

In addition to the technical problems solved by the embodiments of the present disclosure, the technical features constituting the technical solutions and the beneficial effects brought about by the technical features of these technical solutions, other technical problems to be solved by the method of manufacturing a semiconductor structure and the semiconductor structure in the embodiments of the present disclosure, other technical features included in the technical solutions and beneficial effects brought about by these technical features will be described in further detail in the detailed description.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show some embodiments of the present disclosure, and those of ordinary skill in the art may still derive other drawings from these drawings without creative efforts.

DETAILED DESCRIPTION

There are usually two steps for forming vertical GAA transistors. Specifically, an active layer is deposited on a base, and a part of the active layer is etched, thereby forming a plurality of active pillars arranged at intervals on the base. The active pillars include single components to guarantee the performance of the subsequent transistors hardly. Upon formation of the active pillars, ion doping is performed on top surfaces of the active pillars to form doped regions. However, the active pillars are only provided with one doped region separately, which still cannot meet the requirements on the performance of the subsequent transistors.

In view of the above technical problems, embodiments of the present disclosure provide a method of manufacturing a semiconductor structure and a semiconductor structure. The functional stack having the dopant ions is formed directly on the base, such that the subsequent active pillars are provided with the first doped regions, the second doped regions and the channel regions. The present disclosure solves the technical problem that the ion doping cannot be performed on the active pillars or the active pillars are only provided with one doped region separately, and achieves the better performance of the active pillars and better performance of the semiconductor structure.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely part rather than all of the embodiments of the present disclosure. All other embodiments obtained by those of ordinary skill in the art based on the embodiments of the disclosure without creative efforts shall fall within the protection scope of the present disclosure.

Figure 1:
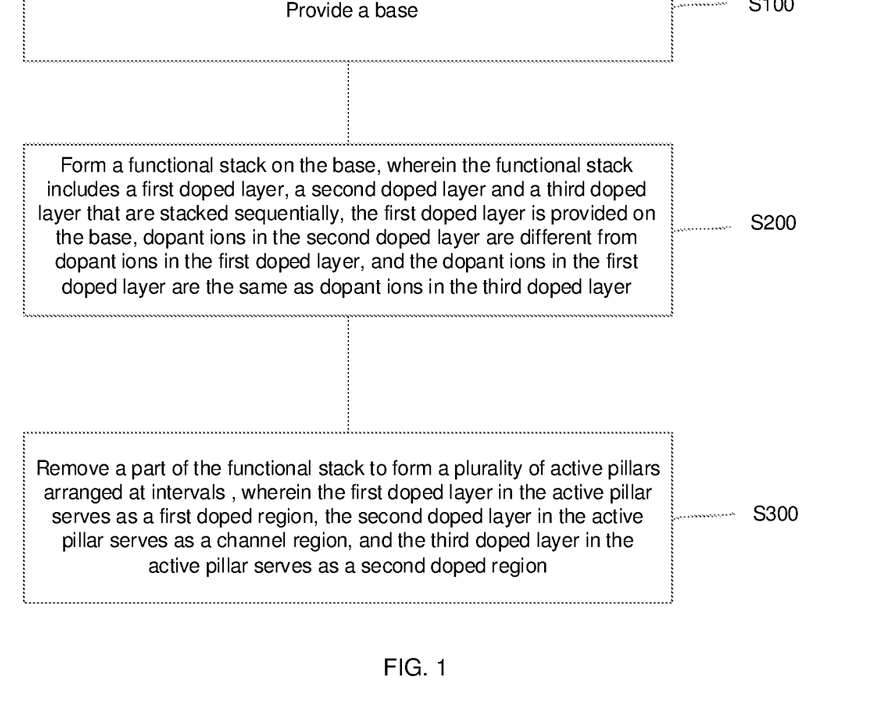
FIG. 1 is a first flowchart of a method of manufacturing a semiconductor structure according to an embodiment of the present disclosure.

FIG. 1 is a first flowchart of a method of manufacturing a semiconductor structure according to an embodiment of the present disclosure. FIG. 5 is a second flowchart of a method of manufacturing a semiconductor structure according to an embodiment of the present disclosure. FIGS. 2-4 and FIGS. 6-17 are schematic views of various stages in a method of manufacturing a semiconductor structure. The method of manufacturing a semiconductor structure will be described in detail below with reference to FIGS. 1-17.

There are no limits made on the semiconductor structure in the embodiment. The semiconductor structure is described below by using a DRAM as an example, but is not limited thereto in the embodiment. Alternatively, the semiconductor structure in the embodiment may be other structures.

As shown in FIG. 1, an embodiment of the present disclosure provides a method of manufacturing a semiconductor structure, including the following steps:

Step S100: Provide a base.

Figure 2:
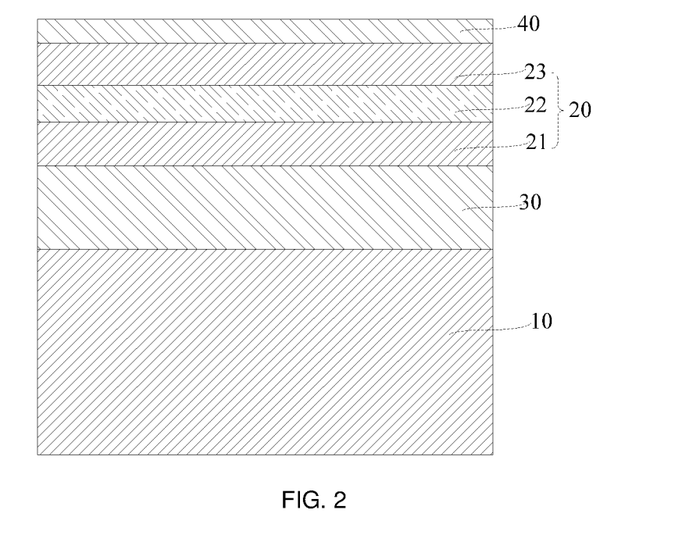
FIG. 2 is a schematic structural view of a functional stack formed in a method of manufacturing a semiconductor structure according to an embodiment of the present disclosure.

Exemplarily, as shown in FIG. 2, a base 10 serves as a support member of the DRAM and is used to support other components thereon. The base 10 may be made of a semiconductor material. The semiconductor material may be one or more of a group consisting of silicon, germanium, a silicon-germanium compound, and a silicon-carbon compound.

Step S200: Form a functional stack on the base, wherein the functional stack includes a first doped layer, a second doped layer and a third doped layer that are stacked sequentially, the first doped layer is provided on the base, dopant ions in the second doped layer are different from dopant ions in the first doped layer, and the dopant ions in the first doped layer are the same as dopant ions in the third doped layer.

Exemplarily, also as shown in FIG. 2, a functional stack 20 may be formed on the base 10 with epitaxial growth. The functional stack 20 may include a first doped layer 21, a second doped layer 22 and a third doped layer 23 that are stacked sequentially. The first doped layer 21 is provided on the base 10. That is, the first doped layer 21, the second doped layer 22 and the third doped layer 23 are arranged sequentially from the bottom up along a direction perpendicular to the base 10.

Dopant ions in the second doped layer 22 are different from dopant ions in the first doped layer 21, and the dopant ions in the first doped layer 21 are the same as dopant ions in the third doped layer 23. It is to be understood that the dopant ions in the first doped layer 21 and the dopant ions in the third doped layer 23 may be N-type ions, and may also be P-type ions in the embodiment. When the dopant ions in the first doped layer are the N-type ions, the dopant ions in the second doped layer are the P-type ions. When the dopant ions in the first doped layer are the P-type ions, the dopant ions in the second doped layer are the N-type ions.

The first doped layer, the second doped layer and the third doped layer are formed similarly and may be manufactured with in-situ doping. For simplification, the forming process of the first doped layer is used as an example for description in the following embodiment.

Exemplarily, a silicon layer is formed on the base 10 with the epitaxial growth. N-type ions such as phosphorus ions are implanted into a deposition device during the growth, such that the N-type ions are doped in the silicon layer to form the first doped layer 21.

In some embodiments, after the step of providing a base, and before the step of forming a functional stack on the base, the method of manufacturing a semiconductor structure further includes:

Form a first conductive layer 30 on the base by in-situ doping, wherein the first conductive layer 30 is configured to form BLs of the semiconductor structure, a material of the first conductive layer includes germanium, and dopant ions are provided in the first conductive layer.

Exemplarily, a germanium layer may be formed on the base 10 with the epitaxial growth. Dopant ions such as phosphorus ions are implanted into a deposition device during the growth, such that the dopant ions are doped in the germanium layer to form the first conductive layer.

It is to be noted that the dopant ions in the first conductive layer may be the P-type ions such as boron ions, and may also be the N-type ions such as phosphorus ions in the embodiment. However, a type of the dopant ions in the first conductive layer is the same as that of the dopant ions in the first doped layer.

For example, when the dopant ions in the first doped layer are the N-type ions, the dopant ions in the first conductive layer are also the N-type ions.

The technical solution in which the BLs are made of titanium nitride and tungsten, by forming the BLs of the semiconductor structure with the first conductive layer 30 having the dopant ions in the embodiment, the resistances of the BLs can be reduced with the high-mobility germanium to achieve the better performance of the semiconductor structure. In addition, as the BLs are manufactured with the active pillars, the method of manufacturing a semiconductor structure can be simplified.

To protect the functional stack, the method of manufacturing a semiconductor structure in the embodiment further includes:

Form a protective layer 40 on the functional stack 20. Exemplarily, a first protective layer is formed on the functional stack 20, a material of the first protective layer including silicon oxide.

A second protective layer is formed on the first protective layer, a material of the second protective layer including silicon nitride.

Figure 3:
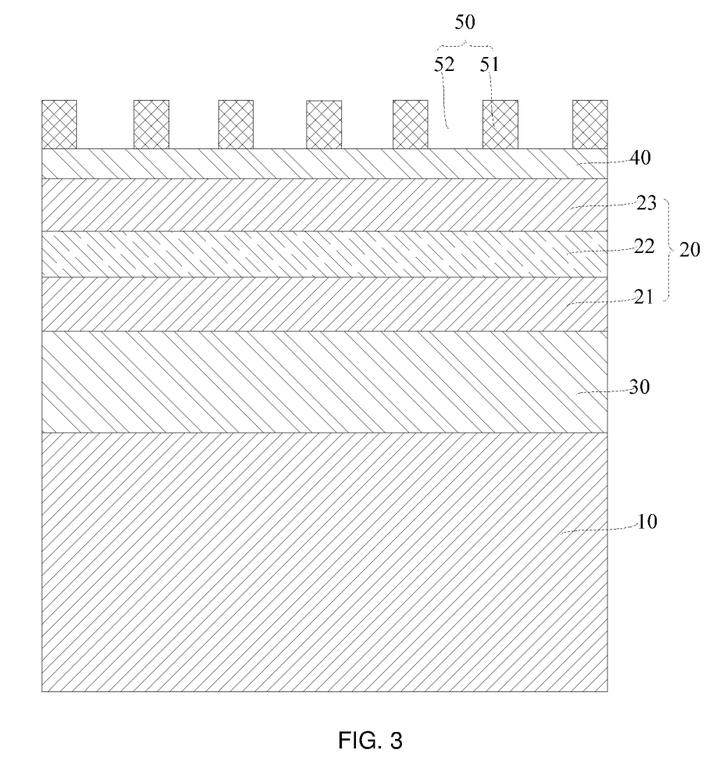
FIG. 3 is a schematic structural view of a first mask layer formed in a method of manufacturing a semiconductor structure according to an embodiment of the present disclosure.
Figure 4:
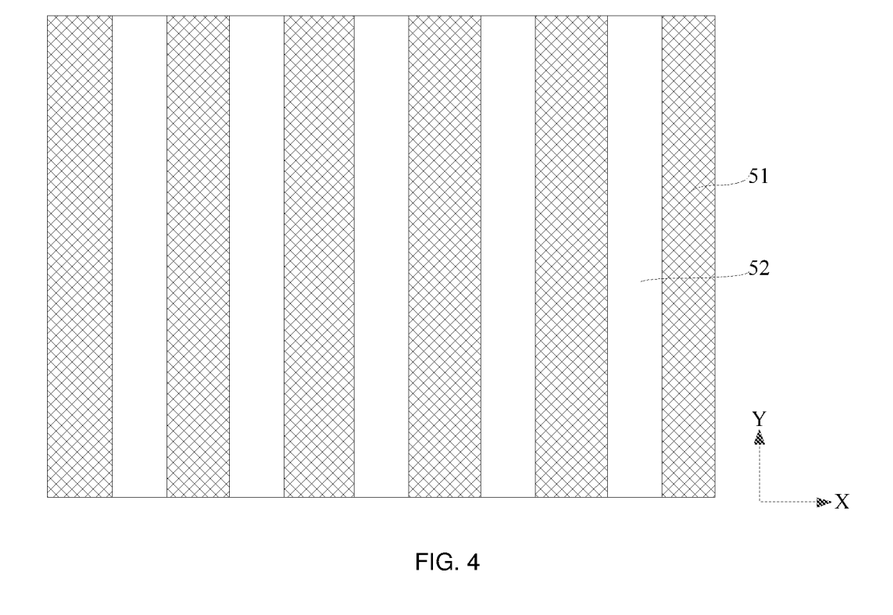
FIG. 4 is a top view of FIG. 3.
Figure 5:
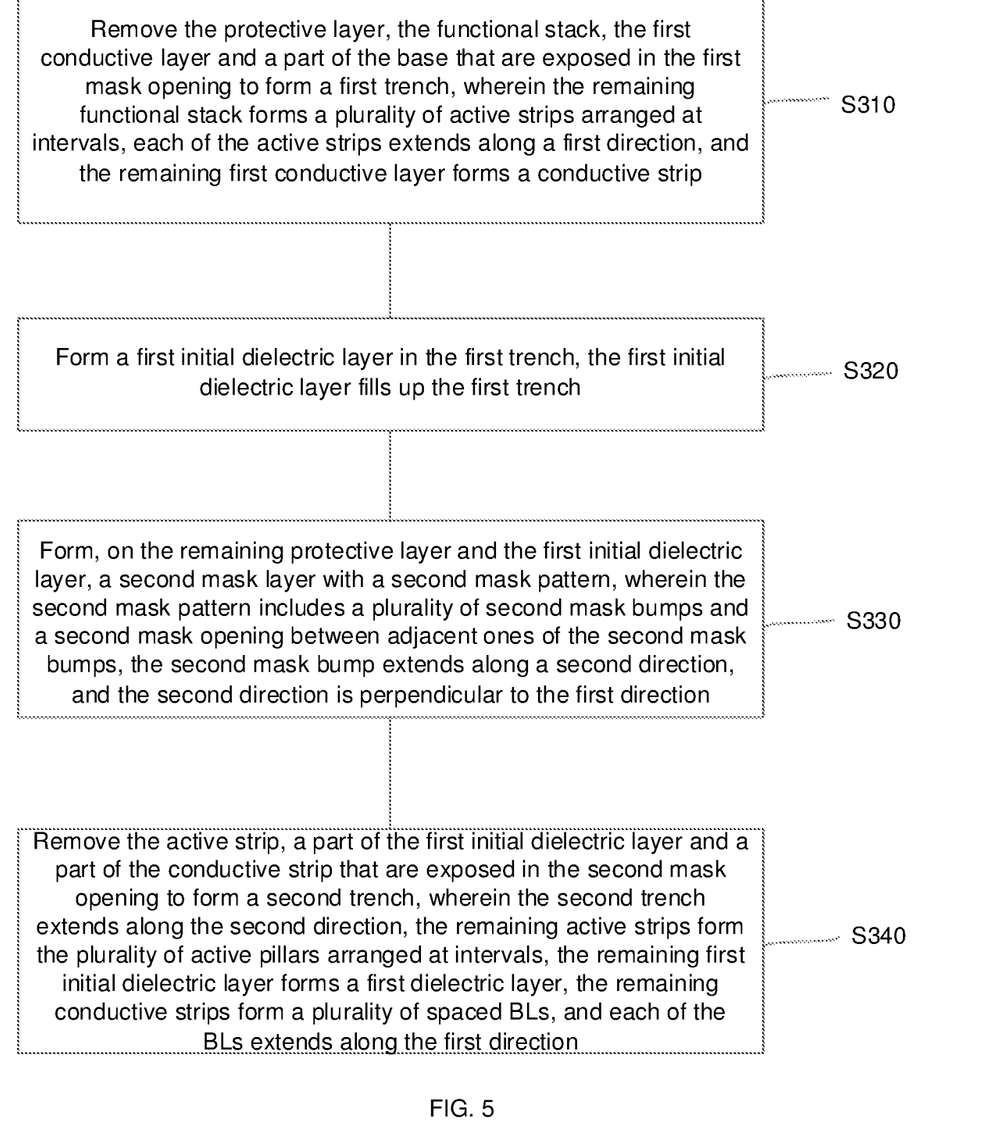
FIG. 5 is a second flowchart of a method of manufacturing a semiconductor structure according to an embodiment of the present disclosure.

As shown in FIG. 3 and FIG. 4, upon formation of the second protective layer, a first mask layer 50 may be formed on the second protective layer, and the first mask layer 50 is patterned, such that the first mask layer 50 has a first mask pattern. The first mask pattern may include a plurality of first mask bumps 51 and first mask openings 52 between adjacent ones of the first mask bumps 51.

Step S300: Remove a part of the functional stack to form a plurality of active pillars arranged at intervals, wherein the first doped layer in the active pillar serves as a first doped region, the second doped layer in the active pillar serves as a channel region, and the third doped layer in the active pillar serves as a second doped region.

Exemplarily, as shown in FIG. 5, Step S310: Remove the protective layer, the functional stack, the first conductive layer and a part of the base that are exposed in the first mask opening to form first trench, wherein the remaining functional stack forms a plurality of active strips arranged at intervals, each of the active strips extends along a first direction, and the remaining first conductive layer forms a conductive strip.

Figure 6:
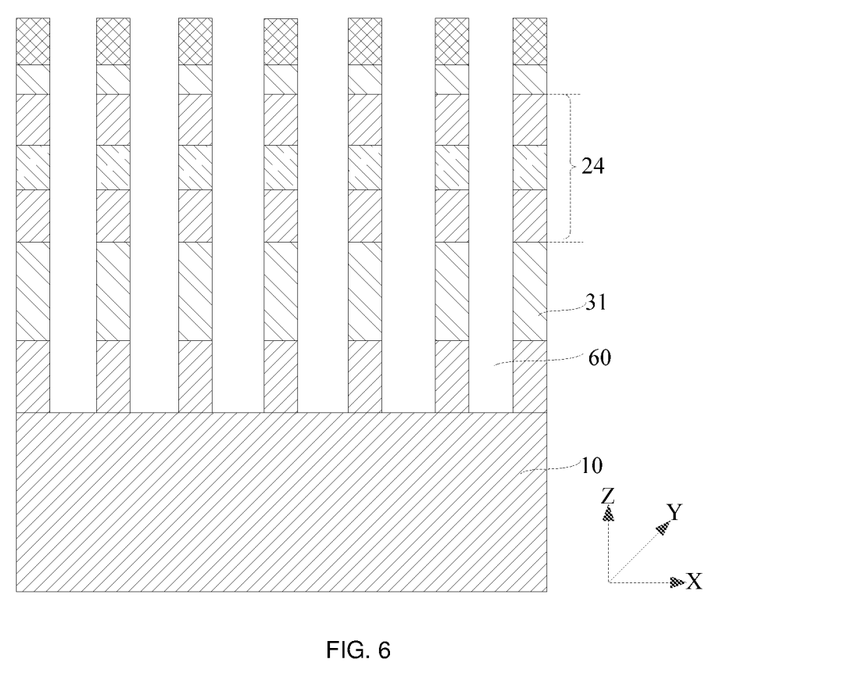
FIG. 6 is a schematic structural view of an active strip formed in a method of manufacturing a semiconductor structure according to an embodiment of the present disclosure.

As shown in FIG. 6, the protective layer 40, the functional stack 20, the first conductive layer 30 and a part of the base 10 that are exposed in the first mask openings 52 may be removed with an etching solution or an etching gas to form a plurality of first trenches 60. A length direction of the first trenches 60 extends along a first direction, namely the length direction of the first trenches 60 extends along the Y direction.

The remaining functional stack 20 forms a plurality of active strips 24 arranged at intervals. The plurality of the active strips 24 are arranged at intervals along a second direction, and extend along the first direction. The second direction is perpendicular to the first direction, and is the X direction in FIG. 6.

The remaining first conductive layer forms conductive strips 31. The conductive strips 31 extend along the first direction, namely the extension direction of the conductive strips 31 is the same as the extension direction of the active strips 24.

Upon formation of the first trenches 60, the first mask layer 50 on the active strips 24 may be removed with a cleaning solution to facilitate subsequent filling of the first trenches 60.

Step S320: Form a first initial dielectric layer in the first trench, the first initial dielectric layer fills up the first trench.

Figure 7:
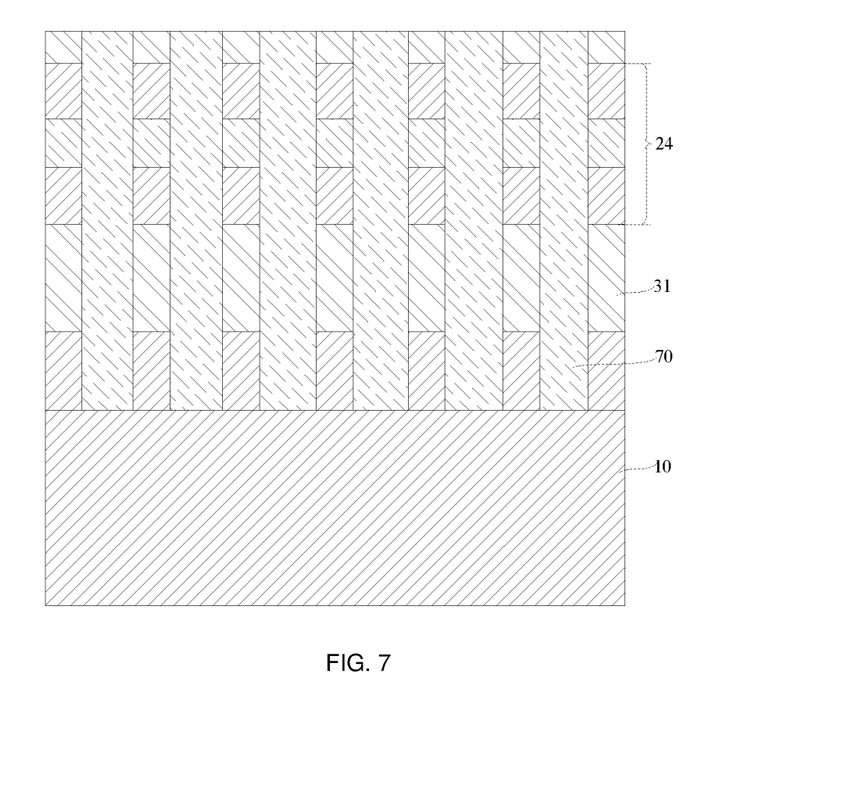
FIG. 7 is a schematic structural view of a first initial dielectric layer formed in a method of manufacturing a semiconductor structure according to an embodiment of the present disclosure.

Exemplarily, as shown in FIG. 7, a first initial dielectric layer 70 may be formed in the first trenches 60 with physical vapor deposition (PVD) or chemical vapor deposition (CVD). The first initial dielectric layer 70 fills up the first trenches 60.

Since the first initial dielectric layer 70 may extend out of the first trenches 60 and cover the remaining protective layer due to the deposition process, the first initial dielectric layer is planarized with chemico-mechanical polishing (CMP) to ensure that a top surface of the first initial dielectric layer 70 is flush with a top surface of the protective layer 40.

A depth of the first trenches is further defined in the embodiment. If the first trenches 60 are less than 150 nm deep, the first conductive layer 30 is etched hardly, such that the subsequent BLs cannot be formed to affect the performance of the semiconductor structure. If the first trenches 60 are greater than 250 nm deep, the base 10 is over-etched to compromise the performance of the semiconductor structure. Therefore, the first trenches 60 are 150 nm-250 nm deep in the embodiment to ensure that the BLs can be formed and the base cannot be over-etched in the subsequent process, thus achieving the better performance of the semiconductor structure.

It is to be noted that a material of the first initial dielectric layer 70 may include an insulating material such as silicon oxide.

Step S330: Form, on the remaining protective layer and the first initial dielectric layer, a second mask layer with a second mask pattern, wherein the second mask pattern includes a plurality of second mask bumps and a second mask opening between adjacent ones of the second mask bumps, the second mask bump extends along a second direction, and the second direction is perpendicular to the first direction.

Figure 8:
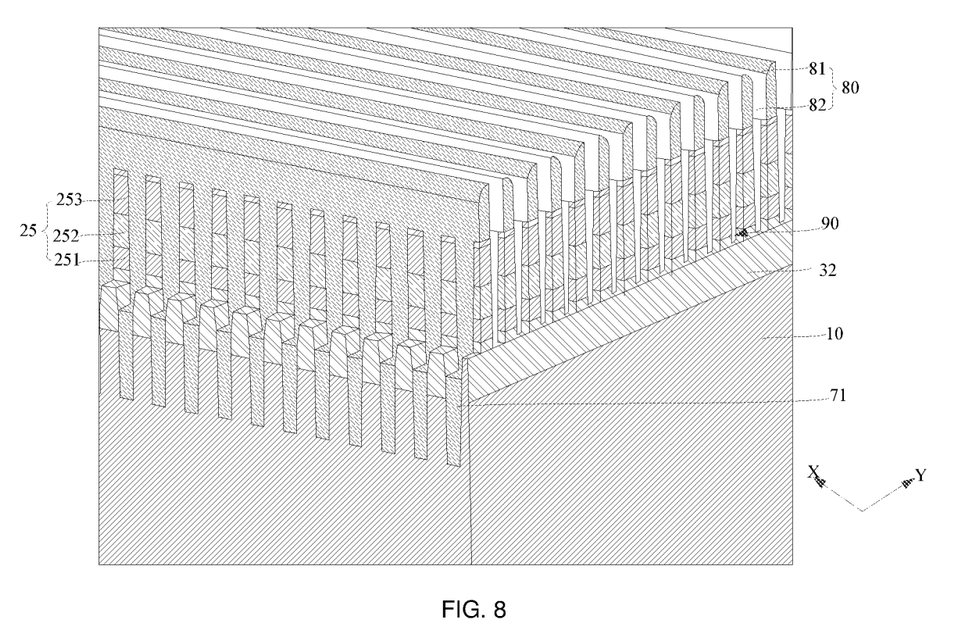
FIG. 8 is a schematic structural view of an active pillar formed in a method of manufacturing a semiconductor structure according to an embodiment of the present disclosure.

Exemplarily, as shown in FIG. 8, a second mask layer 80 may be formed on the remaining protective layer and the first initial dielectric layer. A second mask pattern is formed in the second mask layer 80 by exposure, development or etching. The second mask pattern includes a plurality of second mask bumps 81 and second mask openings 82 between adjacent ones of the second mask bumps 81. The second mask bumps 81 extend along the second direction, namely the extension direction of the second mask bumps 81 is perpendicular to the extension direction of the conductive strips 31.

Step S340: Remove the active strip, a part of the first initial dielectric layer and a part of the conductive strip that are exposed in the second mask openings to form a second trench, wherein the second trench extends along the second direction, the remaining active strips form the plurality of active pillars arranged at intervals, the remaining first initial dielectric layer forms a first dielectric layer, the remaining conductive strips form a plurality of BLs arranged at intervals, and each of the BLs extends along the first direction.

Since the etch selectivity ratio of the first conductive layer 30 is less than that of the first initial dielectric layer 70, the etching rate of the first conductive layer 30 is less than that of the first initial dielectric layer 70 at a same etching speed. As a result, bottom walls of the second trenches 90 are not flat planes but uneven planes in the embodiment.

In the embodiment, the second trenches 90 each have a maximum depth of 100 nm-150 nm, so as not to over-etch the BLs and compromise the performance of the semiconductor structure.

The remaining active strips 24 form the plurality of active pillars 25 in arrays. The first doped layer in the active pillars 25 serves as first doped regions 251, the second doped layer in the active pillars 25 serves as channel regions 252, and the third doped layer in the active pillars 25 serves as second doped regions 253. The first doped region 251 may be one of a source and a drain, and the second doped region 253 may be the other one of the source and the drain.

The remaining conductive strips 31 forms a plurality of BLs 32 arranged at intervals. The BLs 32 extend along the first direction. The etching process is performed twice to form the BLs and the active pillars in the embodiment, so the manufacturing process of the BLs can be simplified.

The remaining first initial dielectric layer forms a first dielectric layer 71. The first dielectric layer 71 isolates the BLs 32 as well as adjacent active pillars 25 arranged in the second direction.

The functional stack having the dopant ions is formed directly on the base, such that the subsequent active pillars are provided with the first doped regions, the second doped regions and the channel regions. The embodiment solves the technical problem that the ion doping cannot be performed on the active pillars or the active pillars are only provided with one doped region separately, and achieves the better performance of the active pillars and better performance of the semiconductor structure.

Upon formation of the active pillars 25, the second mask layer 80 may be removed with a cleaning solution to expose a top surface of the remaining protective layer 40.

Upon removal of the second mask layer 80, the method of manufacturing a semiconductor structure further includes:

Step S400: Form an isolation layer on sidewalls of the second trenches, the isolation layer and the remaining first dielectric layer being connected into a whole.

Figure 9:
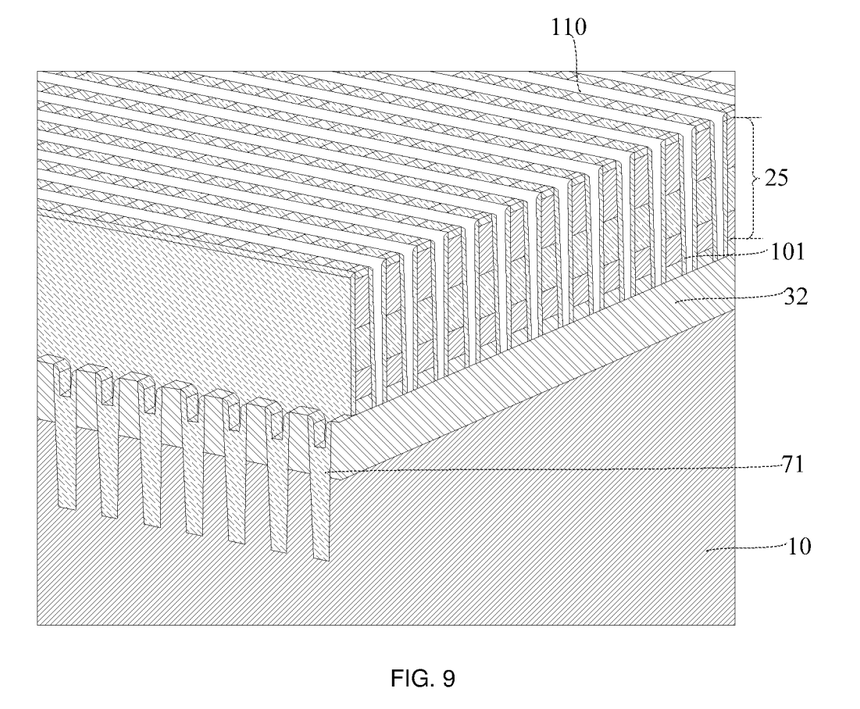
FIG. 9 is a schematic structural view of a first isolation layer formed in a method of manufacturing a semiconductor structure according to an embodiment of the present disclosure.

Exemplarily, as shown in FIG. 9, a first isolation layer 101 is formed on sidewalls of the second trenches 90. The first isolation layer 101 encloses third trenches 110 in the second trenches 90. The first isolation layer 101 is connected to the remaining first dielectric layer. The first isolation layer 101 and the first dielectric layer are made of a same material and both are made of the silicon oxide.

Exemplarily, a first initial isolation layer may be formed on inner walls of the second trenches 90 with atomic layer deposition (ALD). The first initial isolation layer further covers the top surface of the remaining protective layer.

The first initial isolation layer on the top surface of the protective layer and the first initial isolation layer on bottom walls of the second trenches 90 are removed with an etching solution or an etching gas. There remains the first initial isolation layer on sidewalls of the second trenches 90 to form the first isolation layer 101.

Figure 10:
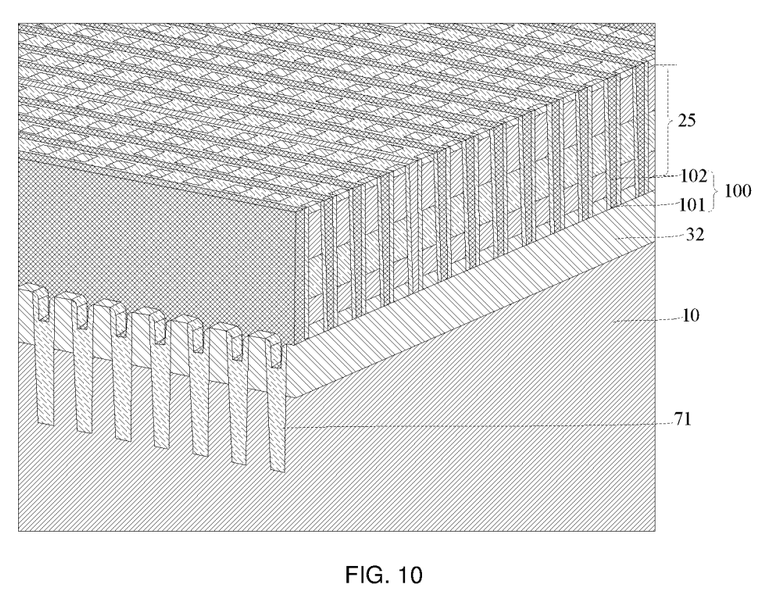
FIG. 10 is a schematic structural view of a second isolation layer formed in a method of manufacturing a semiconductor structure according to an embodiment of the present disclosure.

A second isolation layer 102 is formed in the third trenches 110 with a deposition process. The second isolation layer 102 fills up the third trenches 110. The first isolation layer 101 and the second isolation layer 102 form the isolation layer 100.

In the step herein, since the second isolation layer extends out of the third trenches 110, the second isolation layer is planarized to ensure that a top surface of the second isolation layer is flush with the top surface of the remaining protective layer 40, as shown in FIG. 10.

Upon formation of the isolation layer, a part of the first dielectric layer, a part of the isolation layer and the protective layer are removed with the CMP to expose top surfaces of the second doped regions.

Step S500: Remove a part of the first dielectric layer and a part of the isolation layer to expose the second doped regions of the active pillars.

Figure 11:
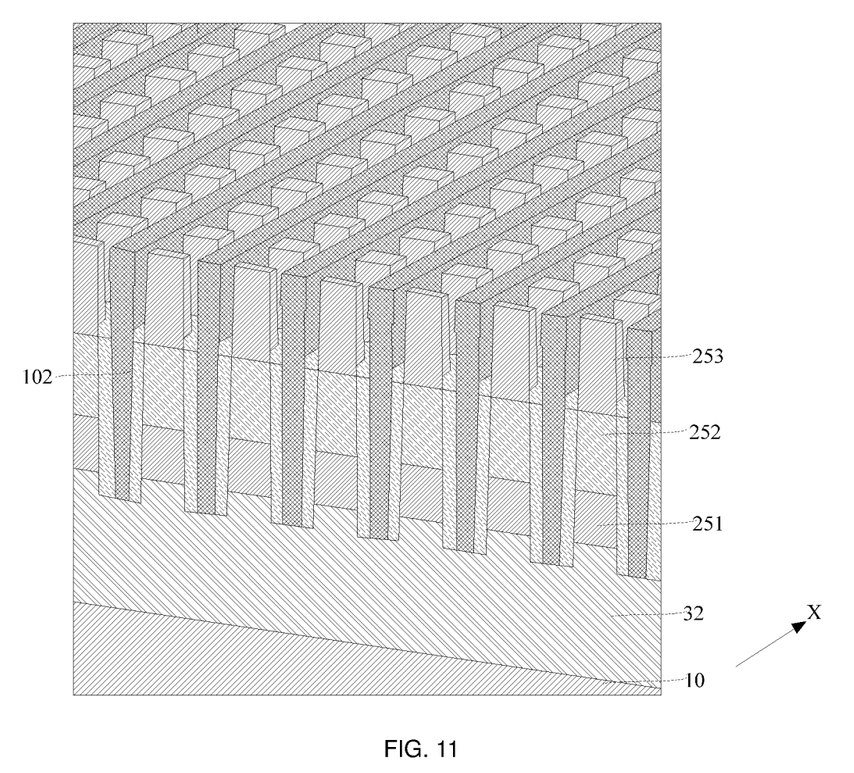
FIG. 11 is a schematic structural view in which some active pillars are exposed in a method of manufacturing a semiconductor structure according to an embodiment of the present disclosure.

As shown in FIG. 11, a part of the first dielectric layer and a part of the isolation layer are removed with isotropic wet etching to expose the second doped regions 253 of the active pillars 25.

In the embodiment, the removed first dielectric layer may be understood as the first dielectric layer 71 around the active pillars 25, and the removed isolation layer may be understood as the removed first isolation layer 101.

Step S600: Form isolation sidewalls enclosing the second doped regions of the active pillars, wherein the isolation sidewalls and the remaining isolation layer are connected into a whole to support the active pillars, the isolation sidewalls and the isolation layer enclose a plurality of etching holes arranged at intervals, and the etching holes are located between adjacent ones of the active pillars along the second directions.

Figure 12:
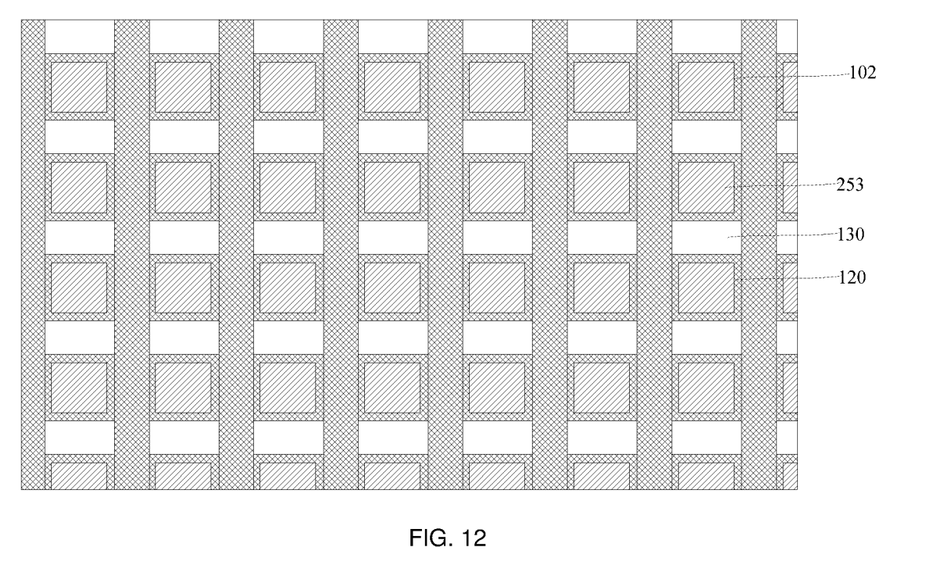
FIG. 12 is a schematic structural view of an isolation sidewall formed in a method of manufacturing a semiconductor structure according to an embodiment of the present disclosure.

As shown in FIG. 12, isolation sidewalls 120 may be deposited. The isolation sidewalls 120 enclose the active pillars 25, and are connected to the second isolation layer 102 to form support structures for supporting the active pillars 25.

A material of the isolation sidewalls 120 and a material of the second isolation layer 102 are the same and may include silicon nitride.

Since the isolation sidewalls 120 each have a thickness less than a distance between adjacent active pillars 25, there are a plurality of etching holes 130 between the isolation sidewalls 120 and the active pillars 25.

Figure 13:
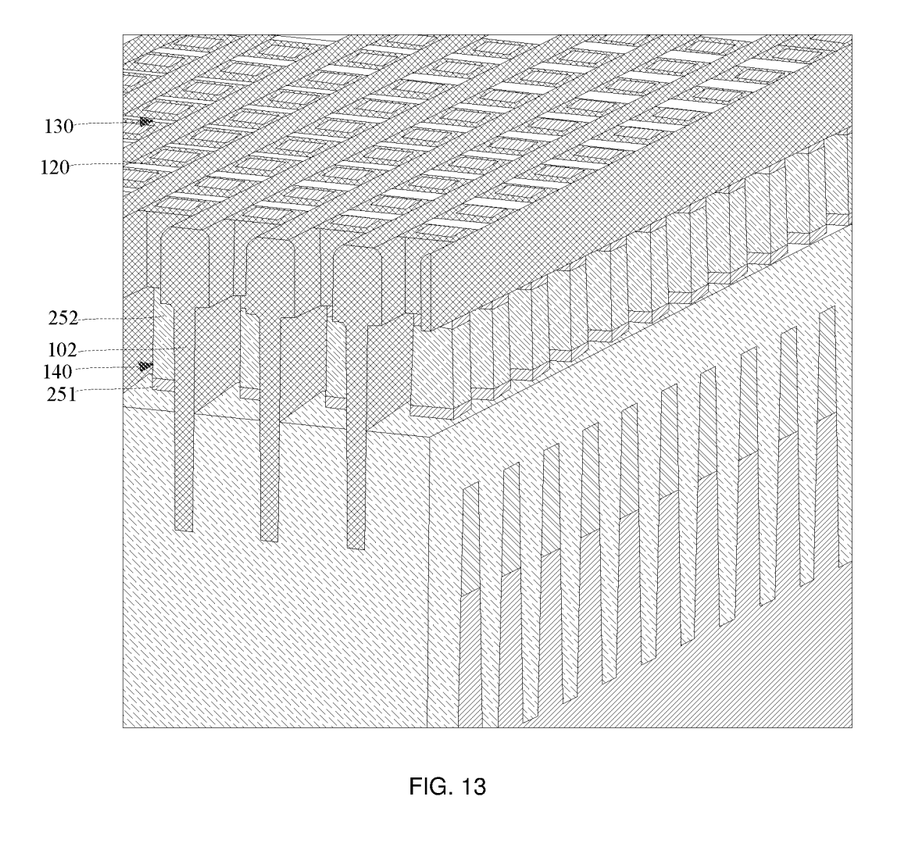
FIG. 13 is a schematic structural view of a first filling region formed in a method of manufacturing a semiconductor structure according to an embodiment of the present disclosure.

Step S700: Remove a part of the first dielectric layer and a part of the isolation layer that are exposed in the etching holes to form first filling regions 140, the first filling regions 140 exposing outer peripheral surfaces of the channel regions 252 of the active pillars 25, and bottom surfaces of the first filling regions 140 being lower than bottom surfaces of the channel regions 252, as shown in FIG. 13.

Step S800: Form an oxide layer in the first filling regions, the oxide layer covering sidewalls of the channel regions and top surfaces of the active pillars, and the oxide layer enclosing second filling regions in the first filling regions.

Figure 14:
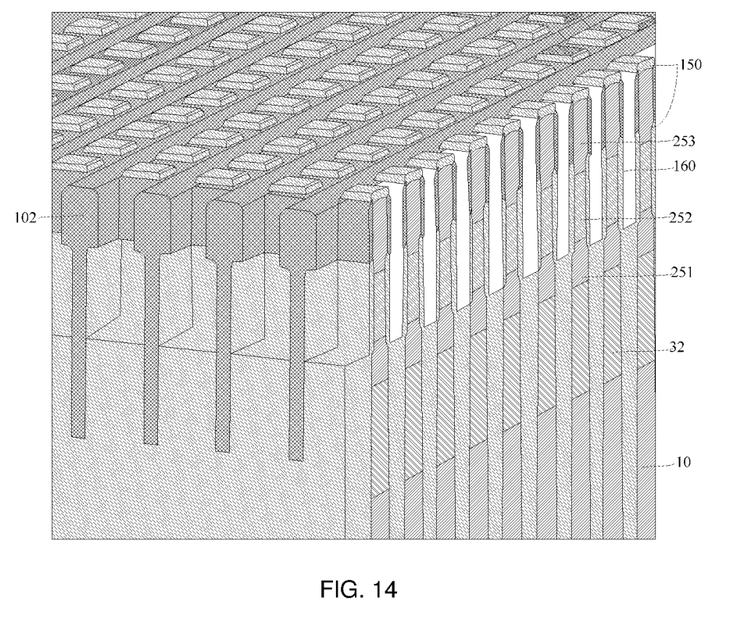
FIG. 14 is a schematic structural view of an oxide layer formed in a method of manufacturing a semiconductor structure according to an embodiment of the present disclosure.

As shown in FIG. 14, a thermal silicon oxide layer is formed on outer peripheral surfaces of the active pillars 25 in the first filling regions 140 and the top surfaces of the active pillars. The thermal silicon oxide layer is cooled to form an oxide layer 150. The oxide layer 150 forms second filling regions 160 in the first filling regions 140.

In addition, the protective layer on the top surfaces of the active pillars 25 can reduce losses to the second doped regions of the active pillars when the oxide layer is formed.

Step S900: Form WLs in the second filling regions, the WLs being connected to the oxide layer on the sidewalls of the channel regions.

Titanium nitride is deposited in the second filling regions. The titanium nitride covers the oxide layer on the top surfaces of the active pillars.

Figure 15:
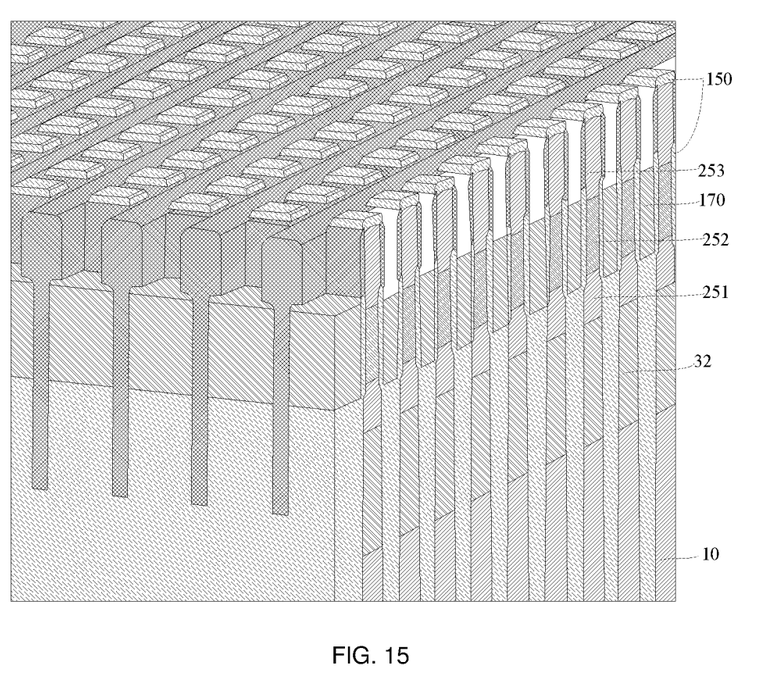
FIG. 15 is a schematic structural view of a WL formed in a method of manufacturing a semiconductor structure according to an embodiment of the present disclosure.

As shown in FIG. 15, the titanium nitride is etched back, and there remains a part of the titanium nitride in the second filling regions. The remaining titanium nitride forms WLs 170.

Figure 16:
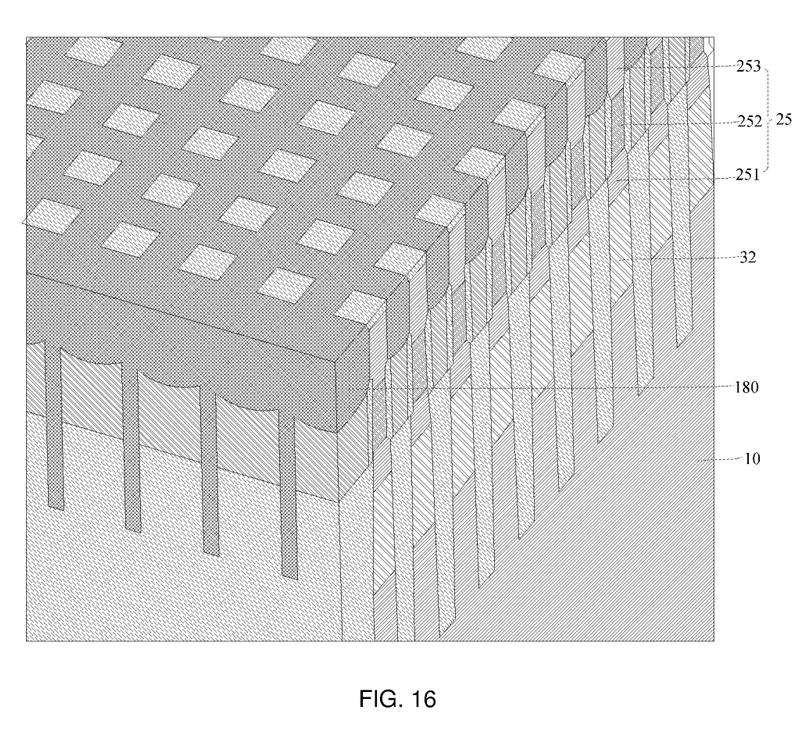
FIG. 16 is a schematic structural view of an insulating layer formed in a method of manufacturing a semiconductor structure according to an embodiment of the present disclosure.

Upon formation of the WLs, the method of manufacturing a semiconductor structure further includes:

As shown in FIG. 16, an insulating layer 180 is formed on the WLs 170, a top surface of the insulating layer 180 being flush with the oxide layer 150 on the top surfaces of the active pillars 25.

The oxide layer 150 on the top surfaces of the active pillars 25 is removed to form contact regions between the active pillars 25 and the insulating layer 180.

Figure 17:
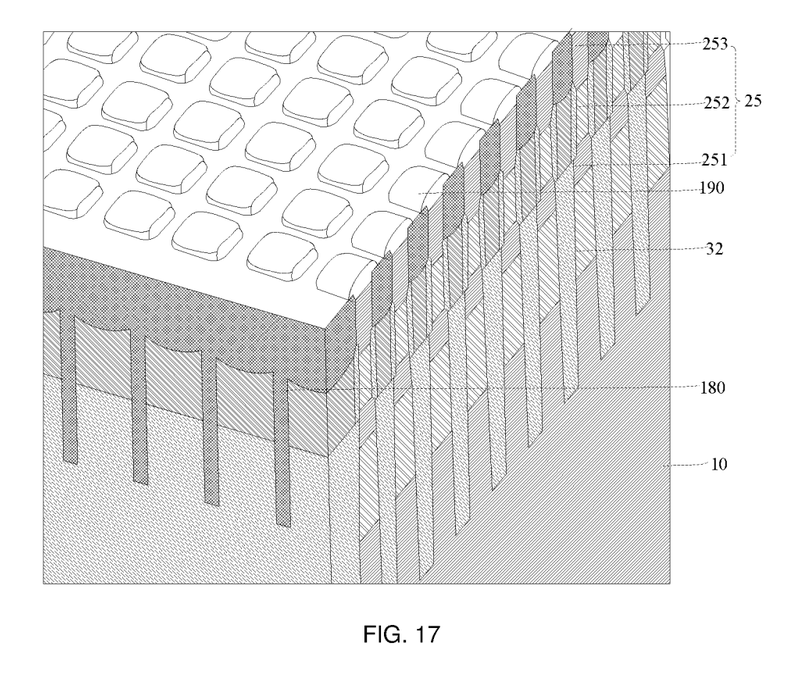
FIG. 17 is a schematic structural view of a contact structure formed in a method of manufacturing a semiconductor structure according to an embodiment of the present disclosure.

As shown in FIG. 17, upon formation of the contact regions, contact structures 190 are formed in the contact regions. The contact structures 190 extend out of the contact regions, and cover a top surface of the insulating layer 180. A projection area of each of the contact structures 190 on the base is greater than a projection area of each of the active pillars 25 on the base.

In the embodiment, a material of the contact structures 190 may include the silicon, and dopant ions are provided in the contact structures. Exemplarily, a silicon layer is formed on the top surfaces of the active pillars with the epitaxial growth. The dopant ions are implanted during the epitaxial growth to form the contact structures.

It is to be noted that the dopant ions may be the N-type ions, and may also be the P-type ions, with the same type as the dopant ions in the second doped regions in the embodiment. For example, when the dopant ions in the second doped regions are the P-type ions, the dopant ions in the contact structures 190 may be the P-type ions. A concentration of the dopant ions in the contact structures 190 is greater than that of the dopant ions in the second doped regions to reduce the contact resistances.

Capacitors are formed on the contact structures 190, thus manufacturing the semiconductor structure completely.

It is to be noted that the processing steps described upon formation of the contact regions are not limited to the above steps in the embodiment of the present disclosure. Upon the formation of the contact regions, the capacitors may further be formed directly in the contact regions, such that the capacitors are connected directly with the second doped regions to ensure the timeliness of signal transmission and achieve the better performance of the semiconductor structure.

An embodiment of the present disclosure further provides a semiconductor structure, which is manufactured with the above method of manufacturing a semiconductor structure.

The semiconductor structure in the embodiment is manufactured with the above manufacturing method. Therefore, active pillars in the semiconductor structure each include a channel region, as well as a first doped region and a second doped regions at two sides of the channel region. The dopant ions in the channel region are different from the dopant ions in the first doped region in type and concentration, such that the better performance of the semiconductor structure can be achieved.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more embodiments or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

The invention claimed is:

1. A method of manufacturing a semiconductor structure, comprising:
   providing a base;
   forming a functional stack on the base, wherein the functional stack comprises a first doped layer, a second doped layer and a third doped layer that are stacked sequentially, the first doped layer is provided on the base, dopant ions in the second doped layer are different from dopant ions in the first doped layer, and the dopant ions in the first doped layer are the same as dopant ions in the third doped layer; and
   removing a part of the functional stack to form a plurality of active pillars arranged at intervals, wherein the first doped layer in the active pillar serves as a first doped region, the second doped layer in the active pillar serves as a channel region, and the third doped layer in the active pillar serves as a second doped region;
   after the providing a base, and before the forming a functional stack on the base, further comprising:
   forming a first conductive layer on the base by in-situ doping, wherein the first conductive layer is configured to form a bit line of the semiconductor structure, a material of the first conductive layer comprises germanium, dopant ions are provided in the first conductive layer, and a type of the dopant ions in the first conductive layer is the same as a type of the dopant ions in the first doped layer;
   after the forming a functional stack on the base, and before the removing a part of the functional stack, further comprising:
   forming a protective layer on the functional stack; and
   forming, on the protective layer, a first mask layer with a first mask pattern, the first mask pattern comprising a plurality of first mask bumps and a first mask opening between adjacent ones of the first mask bumps;
   wherein the removing a part of the functional stack to form a plurality of active pillars arranged at intervals comprises:

removing the protective layer, the functional stack, the first conductive layer and a part of the base that are exposed in the first mask opening to form a first trench, wherein the remaining functional stack forms a plurality of active strips arranged at intervals, each of the active pillars extends along a first direction, and the remaining first conductive layer forms a conductive strip;

forming a first initial dielectric layer in the first trench, the first initial dielectric layer filling up the first trench;

forming, on the remaining protective layer and the first initial dielectric layer, a second mask layer with a second mask pattern, wherein the second mask pattern comprises a plurality of second mask bumps and a second mask opening between adjacent ones of the second mask bumps, the second mask bump extends along a second direction, and the second direction is perpendicular to the first direction; and removing the active strip, a part of the first initial dielectric layer and a part of the conductive strip that are exposed in the second mask opening to form a second trench, wherein the second trench extends along the second direction, the remaining active strips form the plurality of active pillars arranged at intervals, the remaining first initial dielectric layer forms a first dielectric layer, the remaining conductive strips form a plurality of bit lines arranged at intervals, and each of the bit lines extends along the first direction.

2. The method of manufacturing the semiconductor structure according to claim 1, wherein a material of the first doped layer comprises silicon, N-type ions are provided in the first doped layer, a material of the second doped layer comprises the silicon, P-type ions are provided in the second doped layer, a material of the third doped layer comprises the silicon, and the N-type ions are provided in the third doped layer.

3. The method of manufacturing the semiconductor structure according to claim 2, wherein the first doped layer, the second doped layer and the third doped layer are formed by in-situ doping.

4. The method of manufacturing the semiconductor structure according to claim 1, wherein the forming a protective layer on the functional stack comprises:

forming a first protective layer on the functional stack, a material of the first protective layer comprising silicon oxide; and forming a second protective layer on the first protective layer, a material of the second protective layer comprising silicon nitride.

5. The method of manufacturing the semiconductor structure according to claim 1, wherein a depth of the first trench is 150 nm-250 nm.

6. The method of manufacturing the semiconductor structure according to claim 1, wherein a depth of the second trench is 100 nm-150 nm.

7. The method of manufacturing the semiconductor structure according to claim 1, after the removing the active strip exposed in the second mask opening, further comprising:

forming an isolation layer on a sidewall of the second trench, the isolation layer and the remaining first dielectric layer being connected into a whole;

removing a part of the first dielectric layer and a part of the isolation layer to expose the second doped region of each of the active pillars;

forming an isolation sidewall enclosing the second doped region of each of the active pillars, wherein the isolation sidewall and the remaining isolation layer are connected into a whole to support each the active pillar, the isolation sidewall and the isolation layer enclose a plurality of etching holes arranged at intervals, and each of the etching holes is located between adjacent ones of the active pillars along the second direction;

removing a part of the first dielectric layer and the isolation layer that are exposed in the etching hole to form a first filling region, the first filling region exposing an outer peripheral surface of the channel region of each of the active pillars, and a bottom surface of the first filling region being lower than a bottom surface of the channel region;

forming an oxide layer in the first filling region, the oxide layer covering a sidewall of the channel region and a top surface of the active pillar, and the oxide layer enclosing a second filling region in the first filling region; and forming a word line in the second filling region, the word line being connected to the oxide layer on the sidewall of the channel region.

8. The method of manufacturing the semiconductor structure according to claim 7, wherein the forming an isolation layer in the second trench comprises:

forming a first isolation layer on the sidewall of the second trench, the first isolation layer enclosing a third trench in the second trench, and the first isolation layer being connected to the remaining first dielectric layer; and forming a second isolation layer in the third trench, the second isolation layer filling up the third trench, and the first isolation layer and the second isolation layer forming the isolation layer.

9. The method of manufacturing the semiconductor structure according to claim 8, wherein the removing a part of the first dielectric layer and a part of the isolation layer comprises:

removing a part of the first isolation layer and the part of the first dielectric layer, such that a top surface of the remaining first isolation layer is flush with a top surface of the remaining first dielectric layer, and higher than a top surface of the channel region.

10. The method of manufacturing the semiconductor structure according to claim 9, after the forming a word line in the second filling region, further comprising:

forming an insulating layer on the word line, a top surface of the insulating layer being flush with the oxide layer on the top surface of the active pillar;

removing the oxide layer on the top surface of the active pillar to form a contact region between the active pillar and the insulating layer;

forming a contact structure in the contact region, a projection area of the contact structure on the base being greater than a projection area of the active pillar on the base; and forming a capacitor on the contact structure.

11. The method of manufacturing the semiconductor structure according to claim 10, wherein a material of the contact structure comprises silicon, and dopant ions are provided in the contact structure.

* * * * *